United States Patent
Ozturk et al.

(10) Patent No.: US 10,431,726 B2
(45) Date of Patent: Oct. 1, 2019

(54) FLEXIBLE THERMOELECTRIC GENERATOR AND METHODS OF MANUFACTURING

(71) Applicant: North Carolina State University, Raleigh, NC (US)

(72) Inventors: Mehmet Ozturk, Raleigh, NC (US); Michael D. Dickey, Raleigh, NC (US); Collin Ladd, Raleigh, NC (US); Dishit Paresh Parekh, Raleigh, NC (US); Viswanath Padmanabhan Ramesh, Raleigh, NC (US); Francisco Suarez, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 15/584,350

(22) Filed: May 2, 2017

(65) Prior Publication Data

US 2017/0317261 A1     Nov. 2, 2017

Related U.S. Application Data

(60) Provisional application No. 62/330,705, filed on May 2, 2016.

(51) Int. Cl.
*H01L 35/32* (2006.01)
*H01L 35/30* (2006.01)
(Continued)

(52) U.S. Cl.
CPC .............. *H01L 35/32* (2013.01); *H01L 35/02* (2013.01); *H01L 35/225* (2013.01); *H01L 35/30* (2013.01)

(58) Field of Classification Search
CPC ................................ H01L 35/02; H01L 35/32
See application file for complete search history.

(56) References Cited

U.S. PATENT DOCUMENTS

| 6,410,971 | B1 * | 6/2002 | Otey ....................... H01L 35/32 257/467 |
| 2005/0150539 | A1 * | 7/2005 | Ghoshal .................. H01L 23/38 136/205 |

(Continued)

FOREIGN PATENT DOCUMENTS

| WO | WO-2015056855 A1 * | 4/2015 | ............. H01L 35/04 |
| WO | 2015/161202 | 10/2015 | |

OTHER PUBLICATIONS

Suarez et al., "Flexible Thermoelectric Devices Using Bulk Materials," 2016.

*Primary Examiner* — Lindsey A Bernier
(74) *Attorney, Agent, or Firm* — Michael Best & Friedrich LLP

(57) ABSTRACT

Flexible thermoelectric generators and methods of manufacturing are disclosed. In one embodiment, a flexible thermoelectric generator includes a plurality of pillars, a first and a second plurality of flexible interconnects, and a flexible material. The plurality of pillars having a first side and a second side. The first plurality of flexible interconnects electrically connecting pairs of the plurality of pillars on the first side. The second plurality of flexible interconnects electrically connecting the pairs of plurality of pillars on the second side. The first and the second plurality of flexible interconnects alternate among the pairs of plurality of pillars to form an electrical circuit having a first end and a second end. The flexible material covering the first and second plurality of flexible interconnects and having an external surface. The flexible material is configured to conduct thermal energy from the external surface to the plurality of pillars.

10 Claims, 8 Drawing Sheets

(51) Int. Cl.
*H01L 35/22* (2006.01)
*H01L 35/02* (2006.01)

(56) References Cited

U.S. PATENT DOCUMENTS

| | | | |
|---|---|---|---|
| 2013/0218241 A1* | 8/2013 | Savoy | A61F 7/007 607/98 |
| 2014/0020939 A1* | 1/2014 | Nishio | C08J 5/18 174/257 |
| 2015/0014577 A1* | 1/2015 | Chowdhury | C08G 77/50 252/75 |
| 2016/0056360 A1* | 2/2016 | Cho | H01L 35/04 136/205 |

* cited by examiner

Place legs in stencil

Remove legs from Stencil

Planarize PDMS

Prewet legs with Metal

Prewet legs with Metal

Print Metal

Encapsulate in PDMS

Print Backside Contacts and Solder Leads

Encapsulate in PDMS

FLEXIBLE THERMOELECTRIC GENERATOR AND METHODS OF MANUFACTURING

RELATED APPLICATION

This application claims the benefit of U.S. Patent Application No. 62/330,705; filed on May 2, 2016; entitled, "FLEXIBLE THERMOELECTRIC GENERATOR AND METHODS OF MANUFACTURING".

GOVERNMENT RIGHTS NOTICE

This invention was made with government support under grant number 1160483 awarded by the National Science Foundation. The government has certain rights to this invention.

FIELD

The present subject matter relates to thermoelectric generators. More particularly, the present subject matter relates to flexible thermoelectric generators and methods of manufacturing.

BACKGROUND

Thermoelectric generators are devices that convert heat directly into electrical energy using a phenomenon called the Seebeck effect. Typical bulk thermoelectric generators either rely on bulk polycrystalline materials and they have relatively low performance (i.e., low thermoelectric figure-of-merit (ZT)) or they are crystalline materials grown by expensive epitaxial techniques to improve the ZT.

BRIEF SUMMARY

Disclosed herein are flexible thermoelectric generators with flexible and stretchable interconnects and methods of manufacturing. One embodiment provides a flexible thermoelectric generator. The flexible thermoelectric generator includes a plurality of pillars, a first and a second plurality of flexible interconnects, and a flexible material. The plurality of pillars having a first side and a second side. The first plurality of flexible interconnects electrically connecting pairs of the plurality of pillars on the first side. The second plurality of flexible interconnects electrically connecting the pairs of plurality of pillars on the second side. The first and the second plurality of flexible interconnects alternate among the pairs of plurality of pillars to form an electrical circuit having a first end and a second end. The flexible material covering the first and second plurality of flexible interconnects and having an external surface. The flexible material is configured to conduct thermal energy from the external surface to the plurality of pillars.

Another embodiment provides a method of manufacturing a flexible thermoelectric generator. The method includes placing a template pattern on a substrate, the template pattern defining a plurality of recesses that extend towards the substrate. The method includes forming a plurality of pillars within each of the plurality of recesses. The method includes depositing a first flexible material between each of the plurality of pillars forming a first side and a second side opposite from the first side. The method includes depositing a first plurality of flexible interconnects to electrically connect pairs of the plurality of pillars on the first side. The method includes depositing a second flexible material to cover the first plurality of flexible interconnects one the first side. The method includes depositing a second plurality of flexible interconnects to electrically connect the pairs of plurality of pillars on the second side. The first and the second plurality of flexible interconnects alternate among the pairs of plurality of pillars to form an electrical circuit having a first end and a second end. Additionally, the method includes depositing the second flexible material to cover the second plurality of flexible interconnects one the second side.

DETAILED DESCRIPTION

In accordance with embodiments, devices and processes are disclosed that implement flexible and stretchable interconnects (hereinafter referred to as "flexible interconnects") in flexible thermoelectric generators with solid bulk thermoelectric materials. An electric potential or voltage difference ($\Delta V$) may result if there exists a net temperature differential ($\Delta T$) between the two ends of a semiconductor. This phenomenon is known as the Seebeck effect and expressed as $\Delta V = S \Delta T$, where S is the Seebeck coefficient, which is a property of the semiconductor material. The type of doping determines the polarity of the voltage generated across the semiconductor (e.g., p- or n-type). Hence, a larger voltage can be obtained by connecting alternating p-type and n-type semiconductor legs in series.

Figure 1:
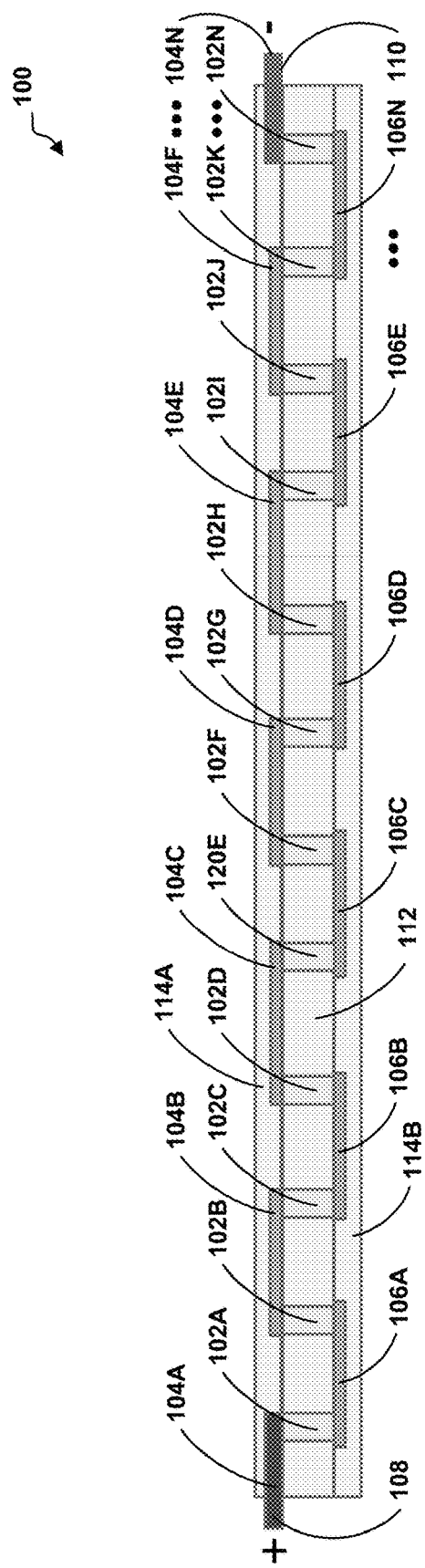
FIG. 1 is a block diagram of a flexible thermoelectric generator in accordance with some embodiments of the present disclosure.

FIG. 1 is a block diagram of a flexible thermoelectric generator 100 in accordance with some embodiments of the present disclosure. In the example of FIG. 1, the flexible thermoelectric generator 100 includes a plurality of pillars 102A-102N (collectively "plurality of pillars 102"), a first plurality of flexible interconnects 104A-104N (collectively "first flexible interconnects 104"), a second plurality of flexible interconnects 106A-106N (collectively "second flexible interconnects 106"), a first electrical link 108, a second electrical link 110, a flexible material 112, and second flexible material portions 114A and 114B (collectively "second flexible material 114"). The plurality of pillars 102 having a first side and a second side.

The first flexible interconnects 104 are stretchable and electrically connect pairs of the plurality of pillars 102 on the first side. The second flexible interconnects 106 are also stretchable and electrically connect the pairs of plurality of pillars on the second side. The first and the second flexible interconnects 104 and 106 alternate between the pairs of plurality of pillars 102 to form an electrical circuit (e.g., a stretchable electrical circuit) having a first end and a second end. The first electrical link 108 is attached and electrically connected to the first end. The second electrical link 110 is attached and electrically connected to the second end.

The flexible material 112 is between each pillar of the plurality of pillars 102. The second flexible material portion 114A covers the first flexible interconnects 104. The second flexible material portion 114B covers the second flexible interconnects 106. The second flexible material 114 has an external surface. For example, the second flexible material 114 has an external surface that is configured to conduct thermal energy at the external surface to the plurality of pillars 102.

In some embodiments, at least one of the first and second flexible interconnects 104 and 106 has liquid metal. For example, the liquid metal may include eutectic gallium-indium (EGaIn), pure gallium, gallium indium tin, other alloys of gallium, other suitable liquid metals, or other suitable liquid metal alloys. In other embodiments, at least one of the first and second flexible interconnects 104 and 106 have nanowires. For example, the nanowires may include silver (Ag) nanowires. In some embodiments, the second flexible material 114 may include a thermally conductive material. For example, thermally conductive materials (e.g., nanowires, graphene, carbon nanotubes, liquid metal, or other suitable thermally conductive materials) in at least one of polyimide, silicones, elastomers, or other suitable materials. In some embodiments, the flexible material 112 may include thermally insulative materials with at least one of polyimide, silicones, elastomers, aerogel, xerogel, gel, sol, combinations thereof, or other suitable stretchable materials.

As illustrated in FIG. 1, the plurality of pillars 102 (e.g., solid bulk legs) are electrically in series and thermally in parallel. One challenge with the thermoelectric generator 100 is to maintain a large temperature differential between the two sides of the plurality of pillars 102 and this requires materials with poor thermal conductivity (λ). The Seebeck coefficient is of direct relation to the quality of the material. High performance thermoelectric devices traditionally employ bulk crystalline materials, which can be grown by epitaxial techniques, but are not flexible. Further, the solid thermoelectric legs are cut from ingots (e.g., bulk ingots) on the order of hundreds of microns thick, and there exists a difference in curvature between the top and bottom faces when the thermoelectric generator is flexed. The difference in curvature may cause cracking if the interconnects are not flexible.

The electrical conductivity of the material forming each of the plurality of pillars 120 is also important for at least two reasons. According to the maximum power transform theorem, the resistance of any load powered by a voltage source should match the internal resistance of the source in the absence of power dissipation and heat losses. This forces the open-circuit voltage of the thermoelectric generator 100 to divide between the internal resistance and the load yielding:

$$P = \frac{\Delta V^2}{4R}$$

where P is power delivered to the load and R is the resistance. Therefore, the power generated by the thermoelectric generator 100 is inversely proportional to its internal source resistance. Accordingly, the internal resistance of the thermoelectric generator 100 is the sum of the electrical resistances of the plurality of pillars 102 because the plurality of pillars 102 are electrically in series. Therefore, the higher the electrical conductivity, the lower the source resistance, and the higher the generated power. The second reason why the electrical conductivity of the plurality of pillars 102 is important stems from the fact that when current flows through the plurality of pillars 102, there are losses including power dissipation and heating, which can reduce the temperature differential. Therefore, semiconductors with high electrical conductivity are needed for efficient thermoelectric generators.

Three important parameters (e.g., Seebeck coefficient, thermal conductivity, and electrical conductivity) are included in a single thermoelectrical figure-of-merit, referred to as the ZT of a material given by:

$$ZT = \frac{\sigma S^2}{\lambda} T$$

An objective of the present disclosure is to create a flexible and stretchable, large-area, high-performance thermoelectric generator with solid bulk thermoelectric materials that have a high thermoelectrical figure-of-merit.

The present disclosure provides techniques for realizing a structure that allows for flexible and stretchable interconnects that electrically connects solid bulk thermoelectric materials in a flexible structure. The flexible interconnects solve issues with using solid bulk thermoelectric materials. First, conventional devices that use solid bulk thermoelectric materials are not flexible to prevent mechanical instability. Secondly, conventional interconnects between the thermoelectric materials are generally not flexible because the conventional interconnects are usually "thick" traces of metal. The traces of metal may be bendable in the sense that plastic may bend, but the bending may cause cracks to form. However, the traces of metal are not stretchable. By creating flexible interconnects, both mechanical stability and robustness for the flexible interconnects and flexibility with solid bulk thermoelectric materials can be achieved for the flexible thermoelectric generator device.

Figure 2:
FIGS. 2-9 are block diagrams illustrating example steps for manufacturing the flexible thermoelectric generator of FIG. 1.
Figure 3:
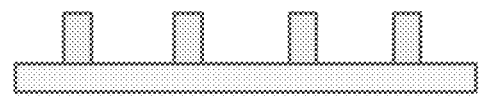
Figure 4:
Figure 5A:
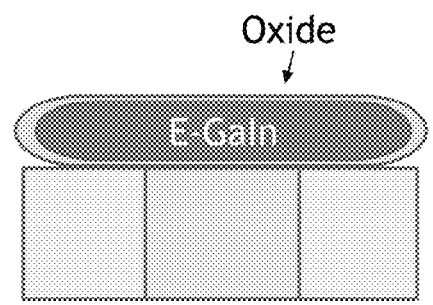
Figure 5B:
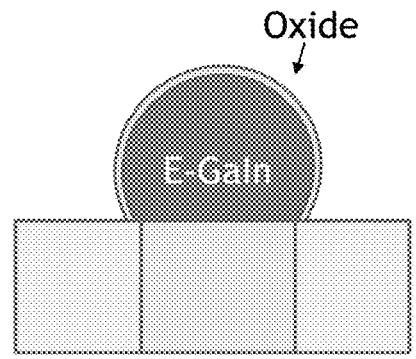

FIGS. 2-9 are block diagrams illustrating one example technique for manufacturing the flexible thermoelectric generator 100 of FIG. 1. In the example of FIG. 2, the plurality of pillars 102 (e.g., solid bulk thermoelectric legs) are placed in a template 200 on top of a substrate 202 (for example, a glass slide). In the example of FIG. 3, the template 200 is removed and the plurality of pillars 102 remain in place on the substrate 202. In the example of FIG. 4, the flexible material 112 is deposited between each of the plurality of pillars 102.

Optionally, in FIG. 4, after depositing the flexible material 112, a first side formed by a first end of the flexible material 112 and a first end of the plurality of pillars 102 are planarized. For example, the flexible material 112 is scrapped off, wet-etched, plasma etched, or otherwise removed. Optionally, in FIGS. 5A and 5B, the first end of each pillar of the plurality of pillars 102 is pre-wet with a metal. For example, the metal deposited is a liquid metal (for example, gallium, eutectic gallium-indium (EGaIn), or other suitable liquid metal) and then rubbed with an agent to eliminate the oxide on the liquid metal. In some embodiments, the agent may be hydrochloric acid (HCl) or other suitable agent.

Figure 6:
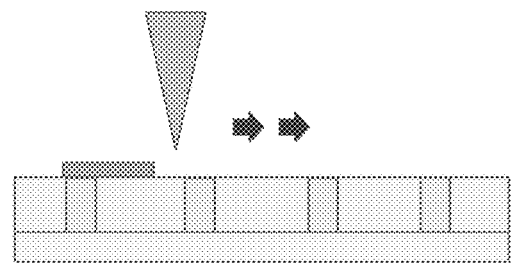
Figure 7:
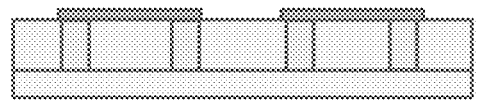

In the example of FIG. 6, the liquid metal is deposited (for example, printed using screen printing, printed using ink-jet printing, printed using direct-write printing, or other suitable deposition technique) to electrically connect pairs of the plurality of pillars 102 and form the first flexible interconnects 104. In the example of FIG. 7, after the first flexible interconnects 104 have been formed, the second flexible material portion 114A is deposited to cover the first flexible interconnects 104. After the second flexible material portion 114A is deposited, the structure can be released from the substrate, flipped over, and the adhesive removed. In some embodiments, isopropyl alcohol can be used to remove the adhesive.

Figure 8:
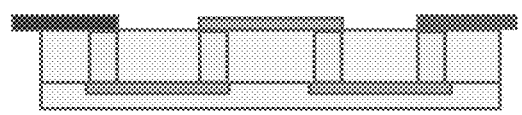
Figure 9:
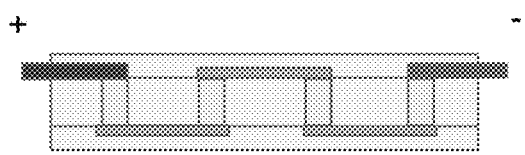

Optionally, in some embodiments, the backside of the plurality of pillars 102 are pre-wet again as described above in FIGS. 5A and 5B. In the example of FIG. 8, the liquid metal is deposited (for example, printed using screen printing, printed using ink-jet printing, printed using direct-write printing, or other suitable deposition technique) to electrically connect pairs of the plurality of pillars 102 and form the second flexible interconnects 106. In some embodiments, electrical links 108 and 110 (e.g., metal leads) may be soldered to the first end and the second end, respectively, to create an interfacing connection. In the example of FIG. 9, after the interfacing connection has been created, the second flexible material portion 114B is deposited to cover the second flexible interconnects 106 and form the flexible thermoelectric generator 100 as illustrated in FIG. 1.

In some embodiments, the flexible material 112 and the second flexible material 114 are created from similar materials. In other embodiments, the flexible material 112 is created from different materials than the second flexible material 114. For example, the material of the flexible material 112 may be stretchable and thermally insulative compared to the material of the second flexible material 114 that may be stretchable and thermally conductive. In some embodiments, both the flexible material 112 and the second flexible material 114 may include polydimethylsiloxane (PDMS), or other suitable material that is flexible. Additionally, in some embodiments, the second flexible material 114 may include at least one of nanowires, carbon nanotubes, graphene, or a liquid metal.

In some embodiments, the liquid metal may also be printed to be in between the pairs of the plurality of pillars 102, but not electrically connected to the circuit, which would increase the thermal conductivity of the flexible thermoelectric generator 100. The fabrication techniques disclosed herein can produce the flexible thermoelectric generator 100 having solid bulk legs along with flexible and stretchable interconnects electrically connecting the solid thermoelectric bulk legs to form an electrical circuit.

Figure 10:
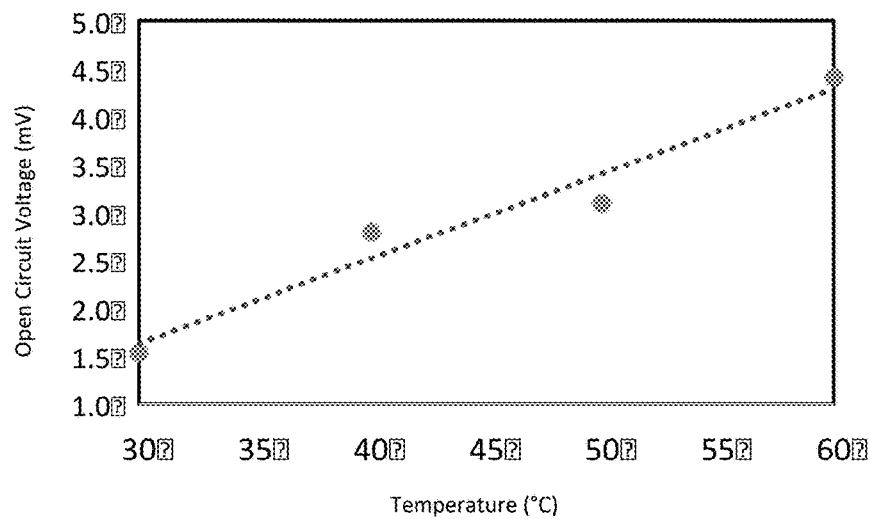
FIG. 10 is a chart illustrating the relationship between the open circuit voltage and the temperature of a heat source applied to the flexible thermoelectric generator of FIG. 1.

FIG. 10 is a chart illustrating the relationship between the open circuit voltage and the temperature of a heat source applied to the flexible thermoelectric generator 100 of FIG. 1. In the example of FIG. 10, the flexible thermoelectric generator 100 may produce an open circuit voltage of about 1.5 millivolts (mV) when the heat source is at about 30 degrees Celsius. The flexible thermoelectric generator 100 may produce an open circuit voltage of about 3 millivolts (mV) at about 40 degrees Celsius. The flexible thermoelectric generator 100 may produce an open circuit voltage of about 3.15 millivolts (mV) at about 50 degrees Celsius. The flexible thermoelectric generator 100 may produce an open circuit voltage of about 4.5 millivolts (mV) at about 60 degrees Celsius.

Figure 11:
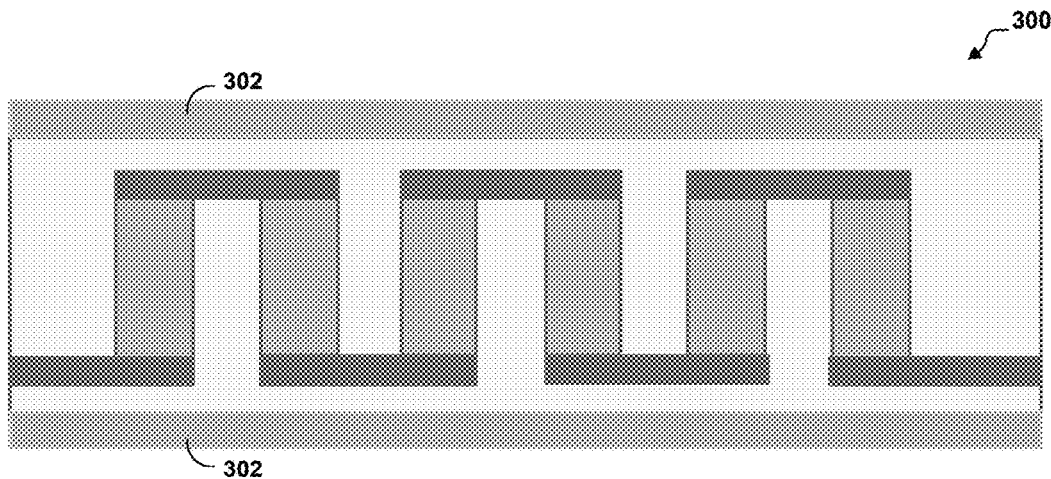
FIG. 11 is a block diagram of another flexible thermoelectric generator in accordance with some embodiments of the present disclosure.

FIG. 11 is a block diagram of another flexible thermoelectric generator 300 in accordance with some embodiments of the present disclosure. In the example of FIG. 11, the flexible thermoelectric generator 300 includes the plurality of pillars 102, the first flexible interconnects 104, the second flexible interconnects 106, the first electrical link 108, the second electrical link 110, the flexible material 112, and the second flexible material 114 as described above. Additionally, the flexible thermoelectric generator 300 includes a heat spreading material 302 covering the external surface of the second flexible material 114. The heat spreading material 302 uniformly spreads thermal energy across the second flexible material 114. The uniform thermal energy conducted via the second flexible material 114 and applied to the plurality of pillars 102 further increases the performance of the flexible thermoelectric generator 300. In some embodiments, the heat spreading material 302 comprises at least one of silver (Ag), gold (Au), carbon (for example, carbon nanotubes or graphene), or other suitable heat spreading material including other metals.

In some embodiments, the heat spreading material 302 has two portions covering the top and the bottom of the flexible thermoelectric generator 300. Alternatively, in some embodiments, the heat spreading material 302 is a uniform layer made up of the second flexible material 114.

In some embodiments, after creating the flexible thermoelectric generator 100 as described above. The heat spreading material 302 may be electrolessly plated on the external surface of the second flexible material 114. Additionally, in some embodiments, titanium (Ti) may be deposited first as an adhesion layer between the external surface of the second flexible material 114 followed by depositing the heat spreading material 302 (e.g., plating silver metal). Alternatively, the heat spreading material 302 may be deposited with any technique for depositing metal onto an elastomer.

Figure 12:
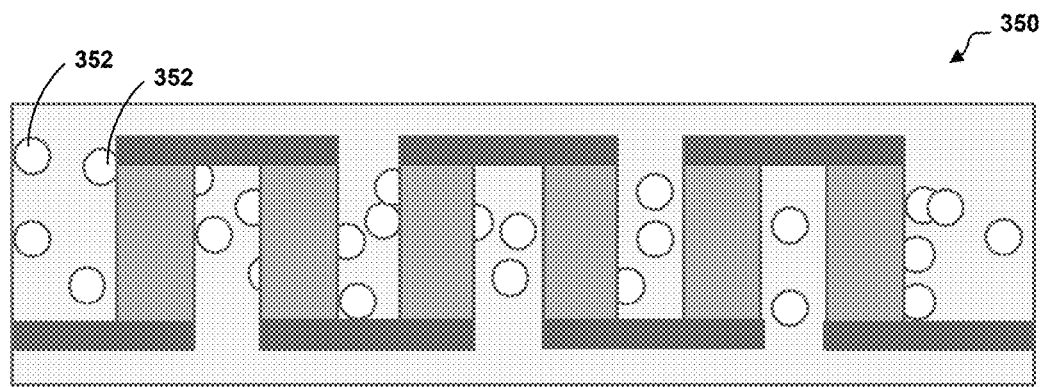
FIG. 12 is a block diagram of another flexible thermoelectric generator in accordance with some embodiments of the present disclosure.

FIG. 12 is a block diagram of another flexible thermoelectric generator 350 in accordance with some embodiments of the present disclosure. In the example of FIG. 12, the flexible thermoelectric generator 350 includes the plurality of pillars 102, the first flexible interconnects 104, the second flexible interconnects 106, the first electrical link 108, the second electrical link 110, the flexible material 112, and the second flexible material 114 as described above. Additionally, in some embodiments, the flexible thermoelectric generator 350 includes bubbles 352 in the flexible material 112. In other embodiments, the flexible thermoelectric generator 350 includes voids 352 (e.g., apertures) that extend through the flexible material 112. The bubbles 352 or voids 352 increase the flexibility of the flexible material 112 while also reducing the thermal conductivity of the flexible material 112. The reduction in thermal conductivity of the flexible material 112 further increases the performance of the flexible thermoelectric generator 350. The increase in performance is from preventing heat entering one side of the flexible thermoelectric generator 350 and seeping through the filler material or the material surrounding the plurality of pillars 102. In other words, injecting the bubbles 352 into or defining the voids 352 in the flexible material 112 reduces the dissipation of the thermal energy within the flexible material 112 and into the second flexible material 114. Alternatively, this increase in performance may be achieved by using a flexible material with low thermal conductivity for the flexible material 112. In some embodiments, the bubbles 352 or the voids 352 include at least one of air, or other suitable gas. For example, while creating the flexible thermoelectric generator 100 as described above, air or other suitable gas may be injected into the flexible material 112 to create the bubbles 352. In another example, while creating the flexible material 112 of thermoelectric generator 100 as described above, a mold may be used to define the voids 352 in the flexible material 112. In yet another example, after creating the flexible material 112 of the thermoelectric generator 100 as described above, a stamp may be used to define the voids 352 in the flexible material 112.

Figure 13:
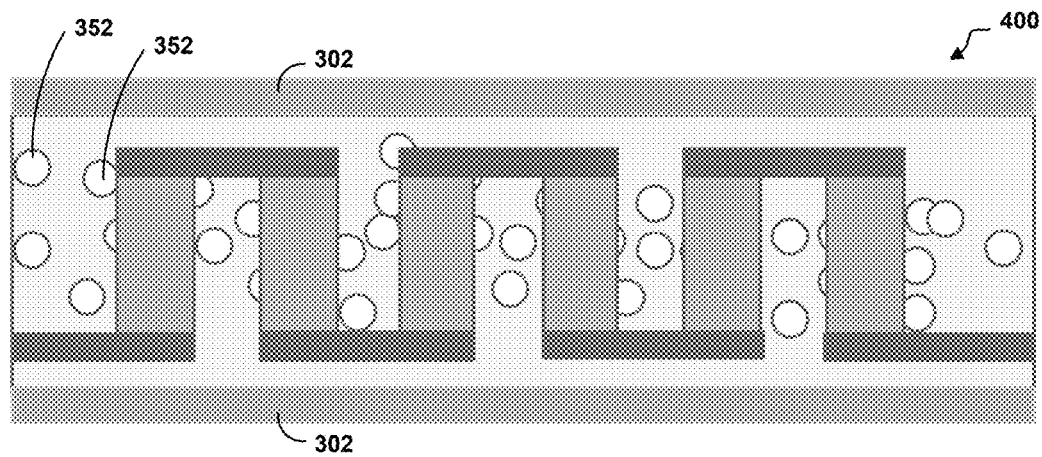
FIG. 13 is a block diagram of another flexible thermoelectric generator in accordance with some embodiments of the present disclosure.

FIG. 13 is a block diagram of another flexible thermoelectric generator 400 in accordance with some embodiments of the present disclosure. In the example of FIG. 13, the flexible thermoelectric generator 400 includes the plurality of pillars 102, the first flexible interconnects 104, the second flexible interconnects 106, the first electrical link 108, the second electrical link 110, the flexible material 112, the second flexible material 114, the heat spreading material 302, and the bubbles 352 as described above. For example, after manufacturing the flexible thermoelectric generator 100 as described above, air may be injected into the flexible material 112 to form the bubbles 352. After forming the bubbles 352, the heat spreading material 302 may be electrolessly plated onto the external surface of the second flexible material 114.

Figure 14:
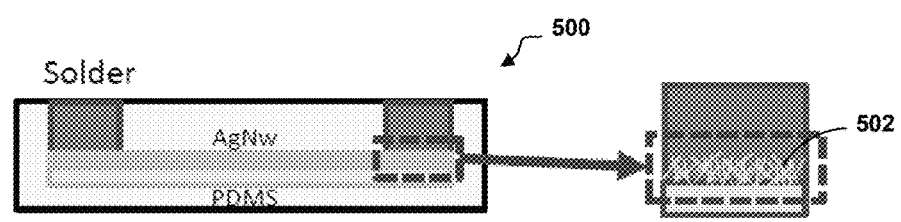
FIG. 14 is a block diagram of another flexible interconnect in accordance with some embodiments of the present disclosure.

FIG. 14 is a block diagram of another example flexible interconnect 500 of the flexible thermoelectric generator 100 of FIG. 1. Instead of depositing a liquid metal to form the first and second flexible interconnects 104 and 106 as described above, solderable silver (Ag) nanowires 502 in the flexible interconnects 500 are deposited and bonded to form the first and second flexible interconnects 104 and 106.

The flexible interconnect 500 may be used as two flexible interconnects (or headers) in place of the rigid substrates used in conventional interconnects. There are three key requirements for this arrangement to work. First, at least one of the substrates must be stretchable—i.e. not just flexible to accommodate the difference in radii of curvature between the two substrates. Without flexibility, the structure is hardly flexible and the bonds can easily break upon forcing the flexible thermoelectric generator to bend. This is especially important for flexible thermoelectric generators with taller legs. Furthermore, for the substrate to stretch, the metal interconnect formed on the substrate should also possess the ability to stretch. The flexible interconnect 500 employs a highly manufacturable nano-enabled stretchable interconnect technology based on metal nanowires and the commonly used stretchable silicone, PDMS. Clearly, there are other techniques proposed to realize stretchable interconnects on flexible devices. However, none of these techniques possess the inherent simplicity and scalability of the nanowire approach described herein. Another key requirement is that the flexible/stretchable substrates must be thermally stable at temperatures needed to realize secure bonds to thermoelectric legs. This implies that the flexible/stretchable materials must be stable at least up to 200 degrees Celsius. The flexible interconnect 500 employs either polyimide and PDMS (or PDMS alone), which are both able to provide the desired thermal stability window.

FIGS. 15-20 are block diagrams illustrating one example technique for manufacturing the example flexible interconnect 500 of FIG. 14. It is important to note that the following description of the technique may be performed in a variety of different ways. For example, availability of printing or dispensing tools may alter one or more of the steps described below.

Figure 15:
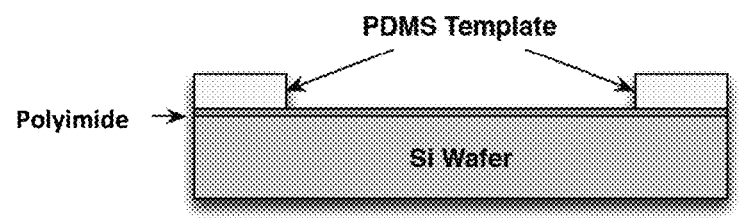
FIGS. 15-20 are block diagrams illustrating one example technique for manufacturing the example flexible interconnect of FIG. 14.
Figure 16:
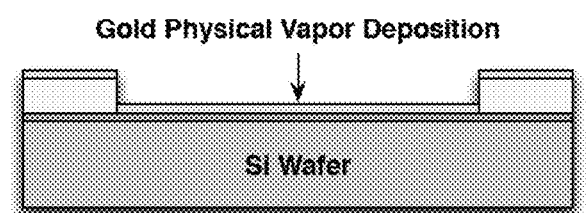
Figure 17:
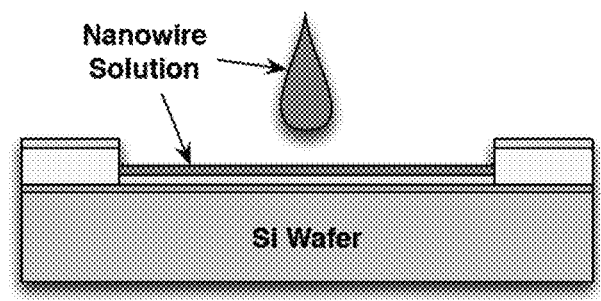
Figure 18:
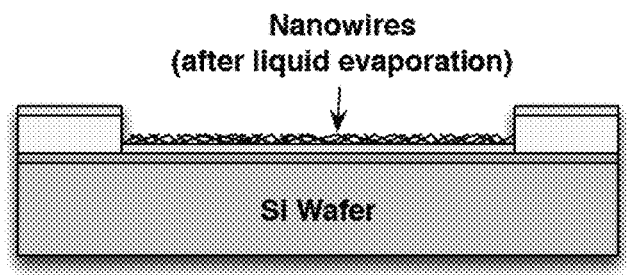
Figure 19:
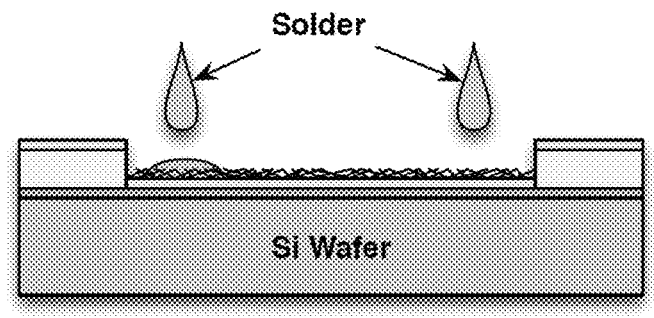
Figure 20:
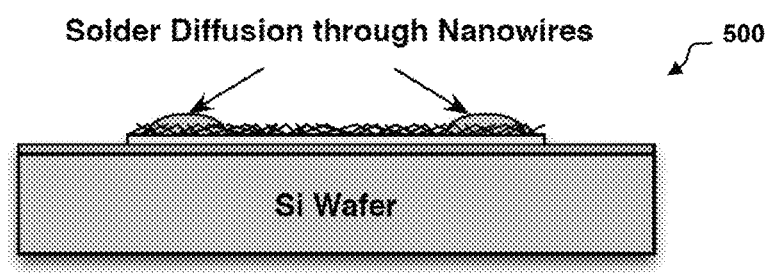
Figure 21:
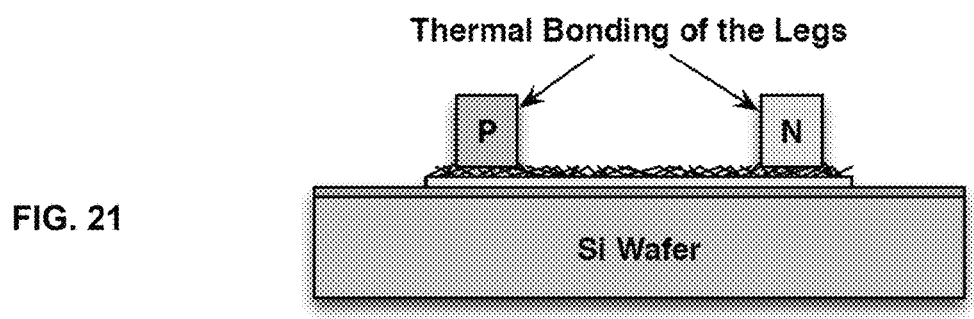
FIGS. 21-24 are block diagrams illustrating another example technique for manufacturing another flexible thermoelectric generator.

In the example of FIG. 15, a thin layer of polyimide (photoresist or another polymeric material) is spun on a silicon substrate to act as a non-stick layer for easy removal of the flexible interconnect 500. The substrate for the process can be any clean wafer. Two thin, uniform sheets of PDMS are cured and placed one on top of the other onto a Kapton sheet and loaded onto a stencil cutter. The pattern for the silver nanowire interconnects is cut out of the PDMS to be used as a shadow mask. A thin layer of uncured PDMS is spread under the lower layer of the template and the template is placed upon the PDMS coated substrate where it sticks on permanently once the glue is cured. This substrate with its mask is then loaded into a sputtering system where a thin layer of titanium is deposited as an adhesion promoter for Gold. This template is a shadow mask and it can be replaced with other materials. In the example of FIG. 16, a PDMS template is used as a hard mask to vapor deposit gold. Following the deposition of titanium, gold is also sputtered on. While sputtering may be used, the deposition technique may instead use evaporation. Now, the top layer of the shadow mask is peeled off, revealing the un-coated silver nanowire stencil underneath. This is used as a guide to pour the silver nanowires that are suspended in isopropyl alcohol (IPA). In the example of FIG. 17, the PDMS template is used to dropcast the nanowire and ethanol solution. In some embodiments, the substrate is then placed on a hot plate at around 60 degrees Celsius to gently evaporate the IPA, leaving behind a layer of silver nanowires. This may be repeated ten to fifteen times until a satisfactory thickness of silver nanowires is achieved. In the example of FIG. 19, after ethanol evaporation, a series of small dots of solder paste are dispensed onto the silver nanowires layer where a pillar of the plurality of pillars 102 is going to be bonded. In the example of FIG. 20, the liquid solder diffuses through the silver nanowires and wets the gold surface forming a solid bond between the nanowires and the gold layer to create the flexible interconnect 500.

The gold under the silver nanowire layer serves two purposes. First, the gold provides a surface for the liquid solder to wet and attach to, and second the gold shunts the nanowire layer further reducing the effective electrical resistance. The flexible interconnect 500 can then be used to electrically connect pairs of pillars in the plurality of pillars 102 instead of the liquid metal as above in FIG. 6.

Figure 22:
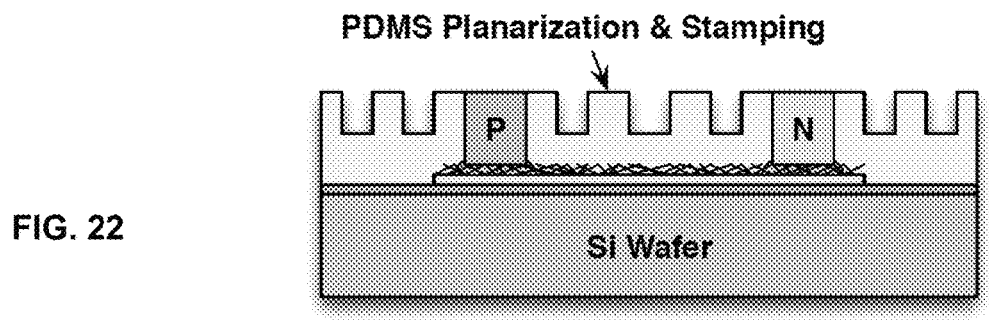

FIGS. 21-24 are block diagrams illustrating another example technique for manufacturing another flexible thermoelectric generator 600. The flexible thermoelectric generator 600 uses the flexible interconnect 500, which may be manufactured as described above in FIGS. 15-20. Additionally, in the example of FIG. 21, the plurality of pillars 602 (e.g., the P and N type solid bulk thermoelectric legs) are then placed on the solder bumps and permanently bonded. In the example of FIG. 22, the flexible material 612 (e.g., a PDMS silicone) is dropcast and planarized to fill the regions between each of the plurality of pillars 602. In some embodiments, during this step, a solid mold may be pressed onto the PDMS to stamp the PDMS and form trenches. The trenches are similar to the injected bubbles or the voids as described above and are filled with air effectively reducing the thermal conductivity of the filler.

Figure 23:
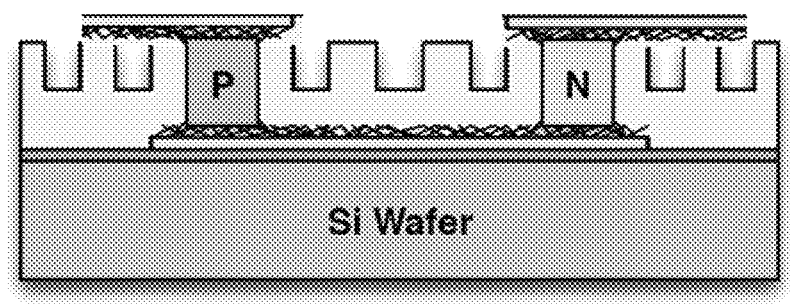
Figure 24:
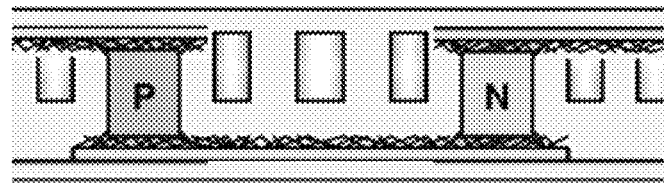

In the example of FIG. 23, a second flexible interconnect 606 with embedded silver nanowires is bonded onto the pairs of the plurality of pillars 602. The preparation of the second flexible interconnect 606 may follow the same process as described above in FIGS. 15-20 with respect to the flexible interconnect 500. In the example of FIG. 24, a second flexible material 614 (e.g., a thin silicone layer) is dispensed to secure the nanowires surrounding the solder bumps and completes the flexible thermoelectric generator 600. This technique provides the thermoelectric generator 600 with flexible interconnects 500 and 606. Alternatively, one of the flexible interconnects 500 and 606 may be made of polyimide with embedded copper pillars as described in the International Application PCT/US2015/026376, filed Apr. 17, 2015, and the content of which is hereby incorporated by reference.

While the embodiments have been described in connection with the preferred embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A flexible thermoelectric generator comprising:
a plurality of pillars having a first side and a second side;
a first plurality of flexible interconnects electrically connecting pairs of the plurality of pillars on the first side;
a second plurality of flexible interconnects electrically connecting the pairs of plurality of pillars on the second side, wherein the first plurality and the second plurality of flexible interconnects alternate among the pairs of plurality of pillars to form an electrical circuit having a first end and a second end;
a first flexible material covering the first and second plurality of flexible interconnects, wherein the first flexible material has an external surface, and wherein the first flexible material is configured to conduct thermal energy from the external surface to the plurality of pillars; and
a second flexible material between each of the plurality of pillars, and with respect to the each of the plurality of pillars, only directly adjacent to the each of the plurality of pillars,
wherein the first flexible material covering the first and second plurality of flexible interconnects comprises polydimethylsiloxane (PDMS) and at least one of:
nanowires,
carbon nanotubes,
graphene, or
a liquid metal.

2. The flexible thermoelectric generator of claim 1, wherein at least one of the first plurality of flexible interconnects or the second plurality of flexible interconnects comprise liquid metal.

3. The flexible thermoelectric generator of claim 2, wherein the liquid metal comprises at least one of gallium or eutectic gallium-indium (EGaIn).

4. The flexible thermoelectric generator of claim 1, wherein at least one of the first and second plurality of flexible interconnects comprise nanowires.

5. The flexible thermoelectric generator of claim 4, wherein the nanowires comprises at least one of silver (Ag) nanowires or copper (Cu) nanowires.

6. The flexible thermoelectric generator claim 1, further comprising:
a first electrical link electrically connected to the first end;
a second electrical link electrically connected to the second end; and
a heating spreading material covering the external surface of the first flexible material, wherein the heating spreading material is configured to uniformly spread the thermal energy across the first flexible material.

7. The flexible thermoelectric generator of claim 6, wherein the heat spreading material comprises a metal or a metal alloy.

8. The flexible thermoelectric generator of claim 1, wherein the second flexible material includes at least one of bubbles or voids.

9. The flexible thermoelectric generator of claim 8, wherein the at least one of the bubbles or the voids comprise air.

10. The flexible thermoelectric generator of claim 1, wherein the second flexible material and the first flexible material comprise a common material.

* * * * *